United States Patent
Aspar et al.

(10) Patent No.: US 7,029,548 B2
(45) Date of Patent: Apr. 18, 2006

(54) METHOD FOR CUTTING A BLOCK OF MATERIAL AND FORMING A THIN FILM

(75) Inventors: Bernard Aspar, Rives (FR); Chrystelle Lagache, St. Laurent du Pont (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/312,864

(22) PCT Filed: Jul. 11, 2001

(86) PCT No.: PCT/FR01/02239

§ 371 (c)(1),
(2), (4) Date: Jun. 13, 2003

(87) PCT Pub. No.: WO02/05344

PCT Pub. Date: Jan. 17, 2002

(65) Prior Publication Data

US 2003/0234075 A1    Dec. 25, 2003

(30) Foreign Application Priority Data

Jul. 12, 2000    (FR) ................................. 00 09129

(51) Int. Cl.
*B32B 35/00*    (2006.01)

(52) U.S. Cl. ........................ 156/239; 156/344; 438/458

(58) Field of Classification Search ................ 156/239, 156/344, 529, 584; 438/455, 458; 83/177
See application file for complete search history.

(56) References Cited

U.S. PATENT DOCUMENTS

| 5,374,564 A | 12/1994 | Bruel |
| 5,811,348 A | 9/1998 | Matsushita et al. |

(Continued)

FOREIGN PATENT DOCUMENTS

| EP | 0 793 263 | 9/1997 |

(Continued)

OTHER PUBLICATIONS

A. Agarwal et al.: "Efficient production of silicon-on-insulator films by co-Impantation of HE+ with H+" Applied Physics Letters, American Institute of Physics, vol. 72, No. 9, pp. 1086-1088 Mar. 2, 1998.

*Primary Examiner*—Mark A. Osele
(74) *Attorney, Agent, or Firm*—Oblon, Spivak, McClelland, Maier & Neustadt, P.C.

(57) ABSTRACT

A process for cutting out a block of material includes a step of introducing ions in the block thereby forming an embrittled zone and defining at least one superficial part of the block. The method also includes a step of forming at least one separation initiator at the level of the embrittled zone, wherein the step of forming the separation initiator includes implanting ions of an ionic nature different from that introduced during the preceding step. The method further includes a step of separating at the level of the embrittled zone the superficial part of the block from a remaining part of the block from the separation initiator, wherein the separation step includes at least one of a thermal treatment and the application of mechanical forces acting between the superficial part and the embrittled zone.

13 Claims, 3 Drawing Sheets

U.S. PATENT DOCUMENTS

| | | |
|---|---|---|
| 5,909,627 A | 6/1999 | Egloff |
| 5,994,207 A | 11/1999 | Henley et al. |
| 6,020,252 A | 2/2000 | Aspar et al. |
| 6,146,979 A * | 11/2000 | Henley et al. ............ 348/458 |
| 6,513,564 B1 * | 2/2003 | Bryan et al. ............ 156/584 |
| 6,756,286 B1 | 6/2004 | Moriceau et al. |
| 6,770,507 B1 * | 8/2004 | Abe et al. ............ 438/64 |

FOREIGN PATENT DOCUMENTS

| | | |
|---|---|---|
| EP | 092 5888 | 6/1999 |
| EP | 0 938 129 | 8/1999 |
| FR | 99 09007 | 7/1999 |
| WO | 00 63965 | 10/2000 |

* cited by examiner

METHOD FOR CUTTING A BLOCK OF MATERIAL AND FORMING A THIN FILM

TECHNICAL FIELD

In a general way, the present invention relates to a process for cutting out a block of material. This process can be implemented, in particular, for the formation of thin films.

Thin films, self-supporting or integral with a support substrate, are widely used in the fields of micro-electronics, opto-electronics and micro-mechanics. Thus the invention is applicable to these domains, in particular for producing components or integrated circuits.

STATE OF PRIOR ART

As mentioned above, the use of thin films is increasingly widespread for components whose operation or manufacturing method requires special physical and electrical properties.

Thin films have a thickness which is usually comprised between a few nanometers and a few micrometers. They also make it possible, for example, to use materials whose usage under the form of a thick substrate would be ruled out for reasons of cost or compatibility with other materials used.

The compatibility of materials can also constitute an obstacle to the direct formation of a thin film on a support substrate on which it is finally used. A certain number of processes have been developed to form first of all a thin film on a source substrate and then to transfer the thin film from the source substrate to a target substrate.

These processes as well as other techniques concerning the manufacture and transfer of thin films are described in documents [1], [2], [3], [4], [5], [6] and [7], whose complete references are given at the end of the present description.

In particular, document [1] describes the possibility of forming an embrittled zone in a plate of material by ionic implantation in order to detach the superficial thin film from the plate later at the level of this zone.

The separation of the thin film from the source substrate is provoked, or at least assisted, by using a certain number of mechanical or thermal stresses. In particular, the cutting out of the thin film requires an energy budget under thermal and/or mechanical form, which is linked mainly to the dose of the species implanted to form the embrittled zone.

The implementation of techniques for cutting out and transferring a thin film, as described in the documents quoted above, can be linked to a certain number of difficulties. For example, the use of certain materials with a high thermal expansion coefficient is not compatible with a thermal treatment at too high a temperature. For certain substrates it is also necessary to limit the dose of the species implanted either to preserve the thin film or for economical reasons.

Furthermore, the implementation of mechanical forces to separate the source substrate from the thin film, such as described above in reference [7], also makes it possible to reduce the thermal budget for fracture, especially in the case where the materials in contact have different expansion coefficients. The application of mechanical efforts on the source substrate and/or the target support is however not always possible, especially when the materials being used are brittle, or when the cleavage zone has not been sufficiently embrittled by ionic implantation.

Finally, the techniques of separation and transfer of the thin film, described above, involve a certain number of restrictions and compromises. These restrictions are imposed, in particular, by the type of materials used to constitute the source substrate, the thin film and the target support.

DESCRIPTION OF THE INVENTION

The aim of the invention is to propose a cutting out method making it possible, in particular, to form and transfer thin films, without the limitations mentioned above.

A further aim of the invention is to propose a cutting out method able to be implemented with a reduced energy budget and in particular a reduced thermal budget.

Another aim of the invention is to propose an economical process in which an eventual implantation of impurities, intended to form an embrittled zone, can be carried out with a reduced dose.

In order to attain these aims, the invention has more precisely the aim of a method for cutting out a block of material, comprising the following stages:

(a) the formation in the block of a buried zone, embrittled by at least one stage of ion introduction, the buried zone defining at least one superficial part of the block, (b) the formation at the level of the embrittled zone of at least one separation initiator by the use of a first means of separation chosen from amongst the insertion of a tool, the injection of a fluid, a thermal treatment and/or implantation of ions of an ionic nature different from that introduced during the preceding stage, and (c) separation at the level of the embrittled zone of the superficial part of the block from a remaining part, called the mass part, from the separation initiator by the use of a second means, different from the first means of separation and chosen from among a thermal treatment and/or the application of mechanical forces acting between the superficial part and the embrittled zone.

The separation initiator(s) can be located on all or part of the periphery of the block and/or on local internal zones of the block, and are capable of spreading into the embrittled zone.

The invention is based on the fact that it is possible to reduce significantly the overall energy for providing the block (either of thermal origin and/or mechanical origin) for implementing a cutting out process, by forming a separation initiator before the actual separation.

The mechanical stresses which can be used profitably for the separation can be stresses applied from outside the block or internal stresses present in the block.

Although the stages are preferably carried out successively in the order indicated, it is possible, at least for certain applications, to carry out stages a and b concomitantly. Moreover, stages b and c can also be concomitant.

According to a special implementation of the process, intended for the manufacture of thin films, it is possible to form an embrittled zone extending closely parallel to a closely plane face of the block, to define in the block a superficial part in the form of a thin superficial film.

By closely plane face, it is understood a face whose mean plane is flat, but which can comprise surface micro-rugosities whose rugosity values range from a few tenths of nanometers to several hundred nanometers. The inventors have been able to show that an implantation across a surface with a micro-rugosity, for example with an RMS (root mean square height) value of 10 nm, does not disturb the embrittling mechanism and subsequent fracture. This fact is interesting since this rugosity is of the order of the rugosity of the free face of the film after transfer. Therefore in these conditions, it is possible to recycle the same substrate several times without recourse to surface polishing.

Advantageously the embrittled buried zone can be formed by implantation.

It involves, for example, an implantation of gaseous species enabling the formation of a thin film of microcavities in the block of material. This film defines the superficial part to be cut out and embrittles the block of material locally.

By gaseous species one understands elements, such as hydrogen or rare gases, for example, in their atomic form (for example H), in their molecular form (for example $H_2$), in their ionic form (for example $H^+$, $H_2^+$), in their isotopic form (for example deuterium), or in their isotopic and ionic form.

Moreover, by implantation one means any technique for introducing the species mentioned above into the block, such as bombardment, diffusion etc. These techniques can be implemented separately or in combination of several together.

As an illustration of implantation techniques, one can refer to the documents quoted above. Nonetheless, thanks to the formation of a separation initiator, according to the invention, the doses of the species implanted to form the embrittled zone can be reduced. The reduced doses make it possible to lower the disturbance of the state of the surface of the thin films, or parts cut out, and thus to control the rugosity.

According to a particular embodiment of the invention, an implantation can be carried out locally by overdosing to form the separation initiator, the first means of separation then corresponding to an overdosing.

This possibility is very interesting in so far as a high dose implantation only takes place in a small part of the block of material. Besides, as indicated above, a much lower dose can be used to form the embrittled zone.

The separation initiator can be formed in a same plane as the embrittled zone as a prolongation of this zone. If the initiation of the initiator is carried out in another plane than that of the embrittled zone, the propagation of the initiator rejoins the embrittled zone.

Several possibilities can be retained for forming the separation initiator.

According to a first possibility, the separation initiator can be formed by an ionic implantation of a species which is different from that reserved for the formation of the embrittled zone.

According to another possibility, one can form the separation initiator by inserting a tool in the block. The first means of separation then corresponds to the insertion of the tool.

According to another possibility, the separation initiator can be formed by local injection of a fluid on the block. The first means of separation then corresponds to the injection of fluid.

According to a further possibility the separation initiator can be formed by local thermal treatment of the block. The first means of separation then corresponds to the local thermal treatment.

In an application of the method of the invention to the formation of a thin film, depending on its thickness, it can advantageously be made integral with a stiffener before the separation stage c (or even before stage b). The stiffener can be deposited at the surface of the block of material, in contact with the thin film to be cut out, according to any deposit technique. It can also be made integral with the thin film by molecular adhesion or by gluing by means of a binder (glue).

On the other hand, when the thin film or the part to be cut out is sufficiently thick or is in a material sufficiently rigid not to tear, the presence of a stiffener is not indispensable. In the remainder of the text, a part or a layer with a thickness or a rigidity sufficient not to tear at the moment of separation, will be called a "self-supporting" part or layer.

Other characteristics and advantages of the invention will become clear from the following description, referring to the figures in the attached drawings. This description is given for purely illustrative and non-limiting reasons.

DETAILED DESCRIPTION OF EMBODIMENTS OF THE INVENTION

In the following description, identical, similar or equivalent parts in the various figures are marked by the same references numbers, so as to make it easier to refer from one embodiment to another.

Moreover, it should be pointed out that the different figures and different parts of figures are not represented on a homogeneous scale, in order to increase the readability of the figures.

Figure 1A:
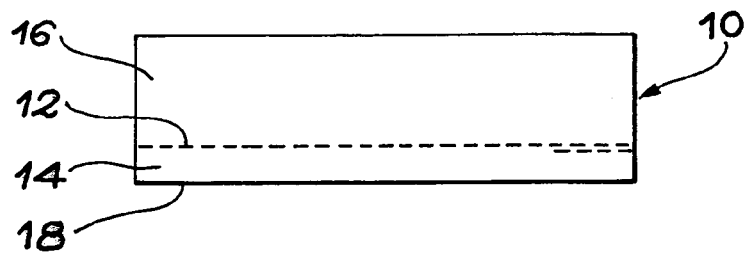
FIGS. 1A to 1D are diagrammatic cross-sections of a substrate and illustrate the stages for cutting out a thin film, supported by a stiffener, according to a method conforming to the invention.

FIG. 1A shows a substrate 10 which constitutes a block of material, homogeneous or not, such as mentioned in the preceding description. This block can, for example, be an ingot or a plate of semiconducting or piezo-electric or ferro-electric material. It may be pre-treated or not. In the case where the block is a semiconducting plate, treated or not, it can, for example, be a silicon substrate.

Ionic implantation of hydrogen with a dose of the order of $7.10^{16} H^+/cm^2$ at an energy of 100 keV, for example, makes it possible to form an embrittled zone 12 in the substrate. This extends closely along a plane parallel to the surface of the substrate through which the impurities have been implanted. In the example shown in the figure the impurities are implanted through a face of the substrate 18 which, in the text below, is called the superficial face. In the substrate 10 the embrittled zone defines a superficial thin film 14 and a mass part 16.

Figure 1B:
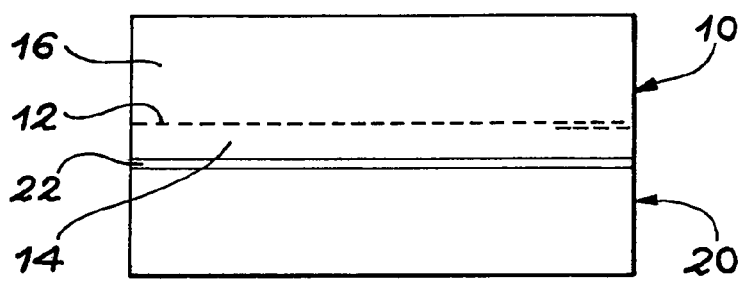

FIG. 1B shows the mounting of the superficial face of the thin film 14 on a second substrate 20 called the target substrate and which can constitute a stiffener for the thin film. It can, for example, be a substrate of fused silica, commonly called quartz.

Solidarisation of the layer 14 with the substrate 20 can be carried out either directly by molecular adhesion, or as shown in the FIG. 1 by the intermediary of at least one layer of material 22 set on the thin film and/or on the substrate. In this latter case, the intermediary layer 22 is chosen either to encourage the molecular adhesion (for example $SiO_2$) or to produce an adhesive gluing (for example a layer of glue).

In the case of direct molecular adhesion between the faces of the two substrates to be assembled, the substrates undergo, for example, a chemical cleaning treatment intended to make the faces to be assembled hydrophilic. After putting the faces to be assembled into contact, the substrates can possibly undergo a first thermal treatment intended to strengthen the adhesion forces. This treatment is carried out, for example, with a thermal budget of the order of 300° C. for 2 hours.

Figure 1C:
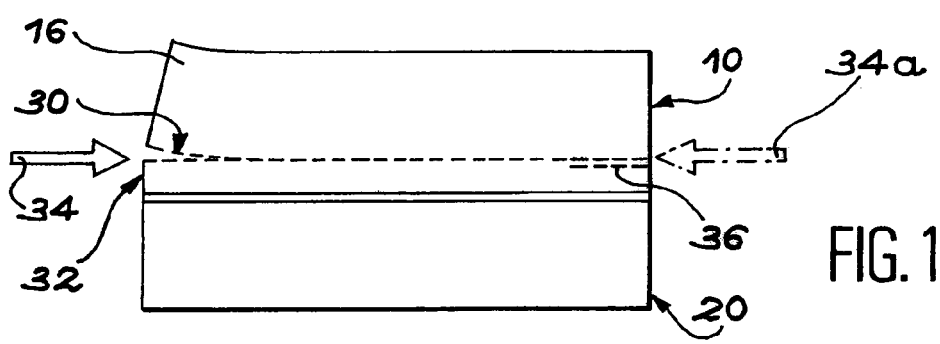

FIG. 1C shows the formation of a separation initiator 30 in the substrate 10. The separation initiator 30 extends from the outside face 32 of the substrate 10, in this case a lateral face on the figure, up to the embrittled zone 12. The separation initiator can be provoked by different means, represented symbolically on the figure under the form of an arrow with reference 34. These means can comprise injection of water or another fluid, or a tool such as a blade, inserted at the level of the embrittled zone.

According to another possibility, the separation initiator can be provoked by ionic implantation with an overdose limited to a region at the edge of the substrate. Such a region is shown on the figures with the reference 36.

Evidently, the overdose can be made in other regions of the substrate such as, for example, a central region.

In this case, the formation of the separation initiator can possibly take place during a same implantation stage implemented also for forming the embrittled zone. To refer to the numeric example given above, region 36 is over-implanted, for example with a dose of $9.10^{16}H^+/cm^2$.

According to a further possibility, a separation initiator can be provoked by overheating the substrate locally (for example with the aid of a laser or a local heat source).

It should be noted here that the term "separation initiator" means, within the framework of the present description, either a region in which the separation has already been started, or a region, particularly brittle, in which the separation will be started at a later stage of actual separation.

An arrow 34a with dotted lines indicates the possibility of forming a plurality of separation initiators.

Figure 1D:
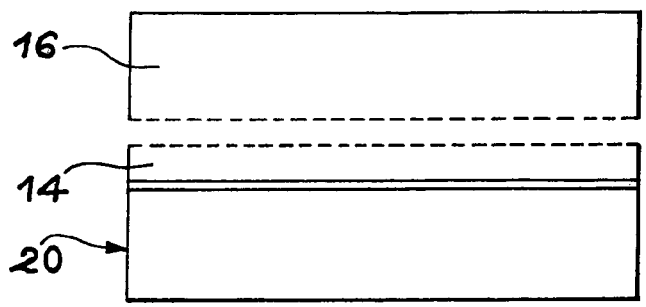

FIG. 1D shows a final stage of separation of the thin film 14 and the mass part 16 of the substrate. The separation can be assisted by applying mechanical forces, under the form of pressure, traction forces of shearing or peeling, and/or a thermal treatment. As an example, in the conditions mentioned above, one can carry out a thermal treatment of a few minutes at 350° C. to obtain total separation. The thermal budget used to obtain separation of the parts takes into account preceding thermal treatments which have been carried out such as, for example, thermal treatment to increase the adherence between the substrates. In every case, this thermal budget is reduced due to the use of the separation initiator.

Finally, one obtains a structure formed of the target substrate 20 with the thin film 14 at its surface.

The mass part 16 of the first substrate can be re-used for later cut-outs of another thin film. Possibly, it can also act as target substrate for the support of another thin film of another material.

With the process illustrated in FIGS. 1A to 1D, it is possible, for example, to obtain other structures as well, comprising non-semiconductor materials on a silicon substrate, for example, such as $LiNbO_3$, $LiTaO_3$ or $SrTiO_3$. It is also possible to transfer layers of semiconductor materials III-V on silicon or on other III-V semiconductors. The process can also be implemented to obtain substrates of the SOI type (silicon on insulator).

The following is an example of the process parameters which can be retained for the manufacture of an SOI support/P13.

At the time of the first stage one carries out an ionic implantation of hydrogen with a dose of $7.10^{16}H^+/cm^2$ at 100 keV in a standard plate of surface oxidised silicon. This implantation makes it possible to define a thin film limited by an embrittled zone. A local overdosing at $9.10^{16}H^+/cm^2$ is carried out at the periphery of the embrittled zone. The overdosing makes it possible to form a separation initiator in the meaning of the invention along a length of 1 to 2 cm, from the edge of the plate in the case of an initiator at the edge of the plate. After mounting the plate on another silicon plate on which the oxide layer is adhered, one proceeds with a thermal separation treatment. It is seen that a treatment of 4 hours at 350° C. makes it possible to obtain a separation which spreads from the initiator to the whole of the embrittled zone.

In the absence of the separation initiator, it should also be possible to provoke separation. Nonetheless in this case, thermal treatment at 350° C. for 11 hours would be required. This demonstrates the significant reduction in the thermal budget imposed on the substrates, resulting from the invention.

Figure 2A:
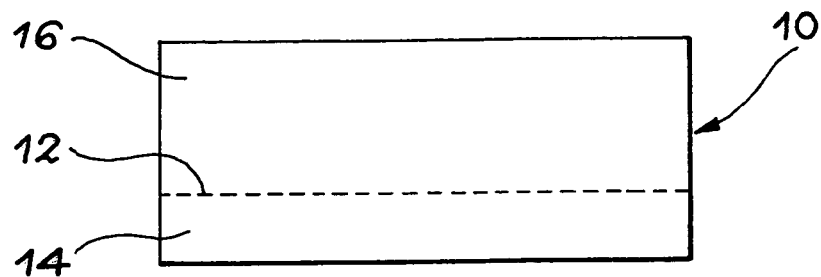
FIGS. 2A to 2C are diagrammatic cross-sections of a substrate and illustrate the stages for cutting out a self-supporting thin film, according to a method conforming to the invention.

FIG. 2A, which shows the first stage of a second possibility of implementation of the invention, is identical to FIG. 1A. Therefore one can refer to the description above concerning this figure.

Figure 2B:
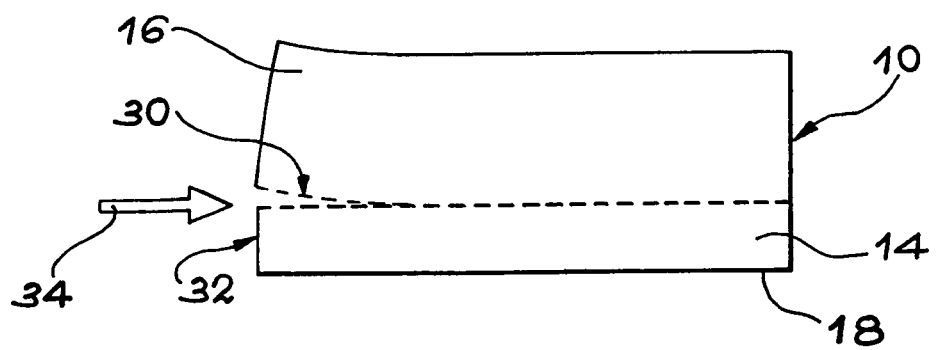

FIG. 2B illustrates the formation of a separation initiator 30. It can be seen that the initiator 30 is used close to the level of the embrittled zone 12 and that, moreover, the surface 18 of the thin film 14 is left free.

Figure 2C:
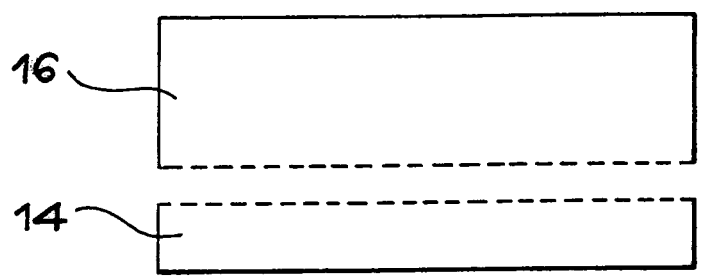

FIG. 2C shows the final stage of separation which is provoked without equipping the thin film 14 with a stiffener. Such an implementation of the process is adapted in particular to the formation of self-supporting thin films.

Figure 3A:
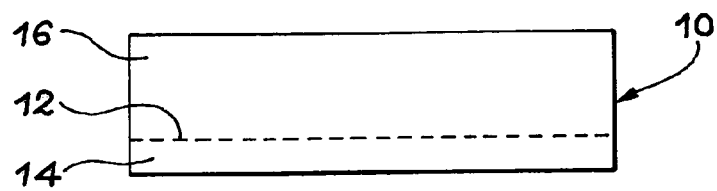
FIGS. 3A to 3D are diagrammatic cross-sections of a substrate and illustrate the stages for cutting out a thin film, supported by a stiffener, according to a method conforming to the invention and constituting a variant relative to the process illustrated by FIGS. 1A to 1D.
Figure 3B:
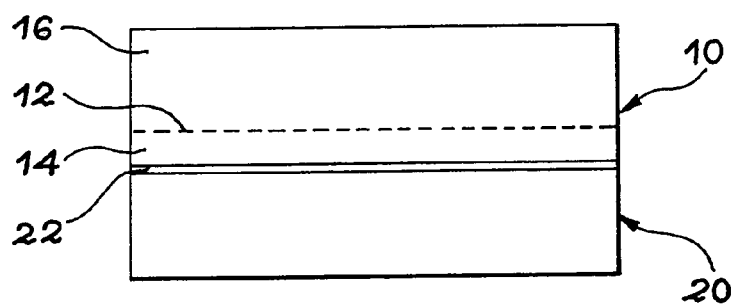

FIGS. 3A to 3D show another possibility of implementing the process. FIGS. 3A and 3B are identical to FIGS. 1A and 1B, and therefore they do not have to described again.

Figure 3C:
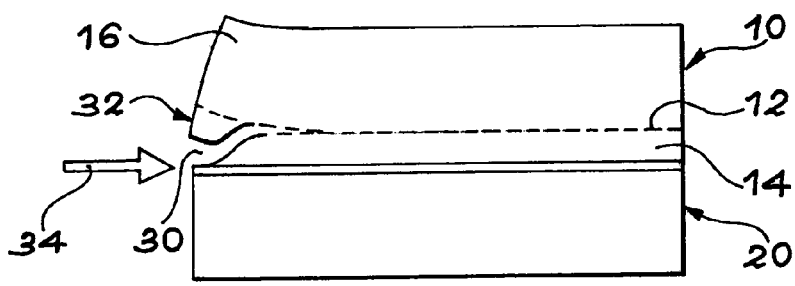
Figure 3D:
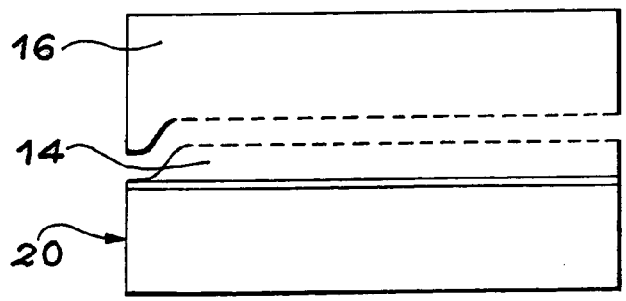

FIG. 3C, which illustrates the formation of a separation initiator, shows that the means of separation 34 can be applied elsewhere than at the level of the embrittled zone 12. In the example of FIG. 3C, a tool, such as a blade, is inserted on a lateral side 32 of the structure, at the level of the interface between the first substrate 10 and the target substrate 20. For example, the tool is inserted at the level of the intermediary layer 22 when this exists. Because of the relatively fine thickness of the thin film, for example lower than or of the order of several μm, that is to say of the low depth of the zone embrittled in the first substrate 20, the separation initiator spreads through the thin layer to rejoin the embrittled zone 12.

FIG. D illustrates the final separation which spreads from the initiator 30 across the whole of the surface of the thin film following the embrittled zone.

As mentioned above, the presence of a separation initiator makes it possible to reduce the thermal budget of the final stage and/or reduce the implantation dose of the embrittled zone. By playing on these two parameters, it is thus possible to control the rugosity of the mass part 16 and, above all, the thin film 14.

DOCUMENTS QUOTED

[1] FR-A-2681472/U.S. Pat. No. 5,374,564
[2] FR-A-2773261
[3] FR-A-2748851

[4] FR-A-9909007
[5] U.S. Pat. No. 5,994,207
[6] EP-A-0925888
[7] FR-A-2748851

The invention claimed is:

1. A process for cutting out a block of material, comprising:
    introducing ions in said block thereby forming an embrittled zone and defining at least one superficial part of the block,
    performing a thermal treatment to increase an embrittlement of the embrittled zone after said introducing,
    forming at least one separation initiator at a level of the embrittled zone after said performing, by implanting ions of an ionic species different from that introduced during said introducing,
    placing the at least one superficial part of the block in contact with a stiffener, and
    separating, at the level of the embrittled zone, the superficial part of the block from a remaining part of the block, from the separation initiator, wherein said separating comprises at least one of a thermal treatment and an application of mechanical forces acting between the superficial part and the embrittled zone.

2. A process according to claim 1, wherein the separation initiator is formed over all or part of the periphery of the block.

3. A process according to claim 1, wherein the embrittled zone extends closely parallel to a closely plane face of the block, to define in the block a superficial thin film.

4. A process according to claim 1, wherein the forming said at least one separation initiator and the separating are concomitant.

5. A process according to claim 1, wherein said forming said at least one separation initiator comprises a local implantation with an overdose.

6. A process according to claim 1, wherein said separating comprises applying mechanical forces applied from outside the block.

7. A process according to claim 3, further comprising:
    depositing at least one layer on the superficial thin film of a material forming said stiffener.

8. A process according to claim 3, wherein the superficial thin film is made integral with said stiffener.

9. A process according to claim 1, further comprising:
    re-using the remaining part of the block of material by cutting out a new superficial part after said separating.

10. A process according to claim 1, further comprising:
    re-using the remaining part of the block of material as a stiffener for a superficial part of another block after said separating.

11. A process according to claim 1, wherein the separation initiator is formed on local internal zones of the block.

12. A process according to claim 3, further comprising:
    gluing together the superficial thin film and the stiffener.

13. A process according to claim 3, further comprising:
    coupling together the superficial thin film and the stiffener via molecular contact adhesion.

* * * * *

UNITED STATES PATENT AND TRADEMARK OFFICE
CERTIFICATE OF CORRECTION

PATENT NO. : 7,029,548 B2 Page 1 of 1
APPLICATION NO. : 10/312864
DATED : April 18, 2006
INVENTOR(S) : Bernard Aspar et al.

It is certified that error appears in the above-identified patent and that said Letters Patent is hereby corrected as shown below:

Column 6, line 39, change " to describe" to --to be described--.

Signed and Sealed this

Twentieth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,029,548 B2  Page 1 of 1
APPLICATION NO. : 10/312864
DATED : April 18, 2006
INVENTOR(S) : Benard Aspar et al.

It is certified that error appears in the above-identified patent and that said Letters Patent is hereby corrected as shown below:

Title page, item (75), change "Chrystelle, Lagache, St. Laurent du Pont (FR)" to
--Christelle LAGAHE, St. Joseph de Riviere (FR)--.

Signed and Sealed this

Fifth Day of October, 2010

David J. Kappos
*Director of the United States Patent and Trademark Office*